United States Patent [19]
Yamazaki et al.

[11] Patent Number: 5,658,115
[45] Date of Patent: Aug. 19, 1997

[54] TRANSFER APPARATUS

[75] Inventors: Takashi Yamazaki, Katsuta; Hiroyuki Sakai, Ibaraki; Hiroshi Sugano, Katsuta; Shigeo Moriyama, Tama, all of Japan

[73] Assignee: Hitachi, Ltd., Tokyo, Japan

[21] Appl. No.: 521,957

[22] Filed: Aug. 31, 1995

Related U.S. Application Data

[63] Continuation of Ser. No. 208,902, Mar. 11, 1994, abandoned, which is a continuation-in-part of Ser. No. 941,683, Sep. 8, 1992, abandoned.

[30] Foreign Application Priority Data

Sep. 5, 1991 [JP] Japan ................... 3-225613

[51] Int. Cl.$^6$ .................................................. B65H 5/08
[52] U.S. Cl. .................... 454/225; 198/468.6; 414/751; 414/935
[58] Field of Search ................... 414/225, 751, 414/935, 937; 294/67, 33, 67.32, 1.1, 67.3, 81.54, 81.52, 103.1; 198/468.6; 410/76, 77, 94

[56] References Cited

U.S. PATENT DOCUMENTS

| | | | |
|---|---|---|---|
| 1,544,011 | 6/1925 | Kearns et al. | 294/67.3 X |
| 3,424,488 | 1/1969 | Renfroe | 294/81.52 X |
| 3,552,794 | 1/1971 | Wright | 294/81.54 X |
| 4,311,427 | 1/1982 | Coad et al. | 414/225 X |
| 4,549,922 | 10/1985 | Oishi et al. | 269/47 X |
| 4,598,453 | 7/1986 | Wills | 269/47 X |
| 4,737,055 | 4/1988 | Scully | 410/76 |
| 4,975,018 | 12/1990 | Lawgerbacher et al. | 294/81.52 X |
| 4,990,047 | 2/1991 | Wagner et al. | 414/935 |
| 5,061,144 | 10/1991 | Akimoto et al. | 414/225 |
| 5,131,799 | 7/1992 | Nishi et al. | 414/225 X |
| 5,177,514 | 1/1993 | Ushijima et al. | 414/937 X |
| 5,277,463 | 1/1994 | Singh et al. | 294/103.1 |
| 5,382,067 | 1/1995 | Baumann | 294/67.33 X |

FOREIGN PATENT DOCUMENTS 2-163927   6/1990   Japan .

*Primary Examiner*—Donald W. Underwood
*Attorney, Agent, or Firm*—Antonelli, Terry, Stout & Kraus, LLP

[57] ABSTRACT

A transfer apparatus is to be used for a wafer loader of an electron beam drawing apparatus, and is constructed particularly in consideration of downsizing of the apparatus as a whole, high-speed transfer for coping with high throughput, and prevention of adhesion of foreign matters for the application to DRAM of 64 and 256 megabits. A transferring mechanism for positioning and fixing an object to be transferred due to combination of positioning projections which are formed on fixing tables on which an object to be transferred is set and transferring arm assemblies and groove portions which are formed in a lower surface of the transferred object. Positioning projections are formed on fixing tables on which an object to be transferred is set and on a transferring arm, and a transferring mechanism for positioning and fixing the object by means of the combination of the positioning projections and groove portions formed in a lower surface of the object is disposed in parallel with a main apparatus. The transferring arm has a vertically moving mechanism and a waiting position of the arm is set in the middle of the transferring path. This transfer apparatus has the structure suitable for high-speed transfer and has less possibility of generation and adhesion of foreign matters. In addition, the apparatus can be reduced in size as a whole.

6 Claims, 5 Drawing Sheets

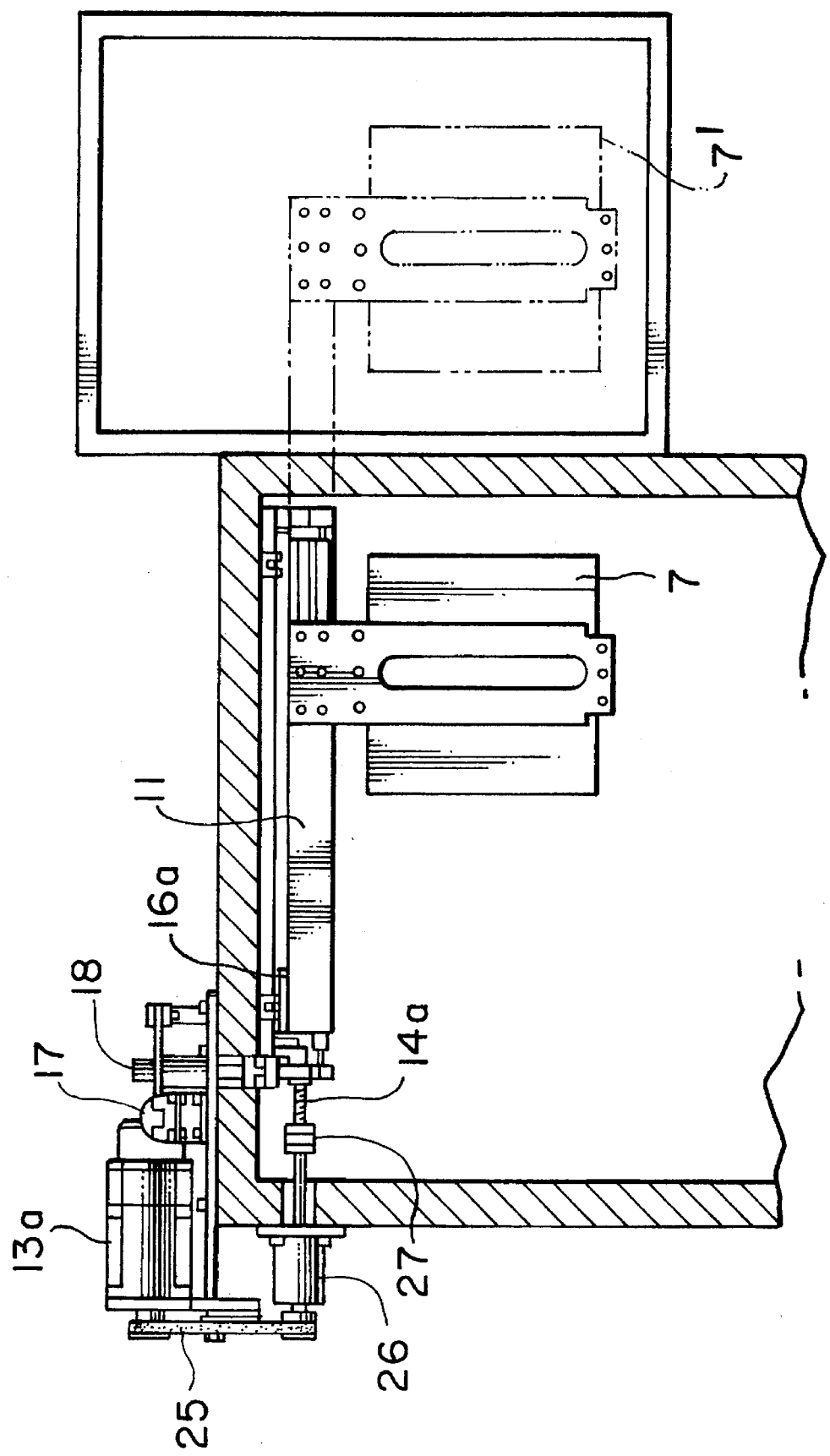

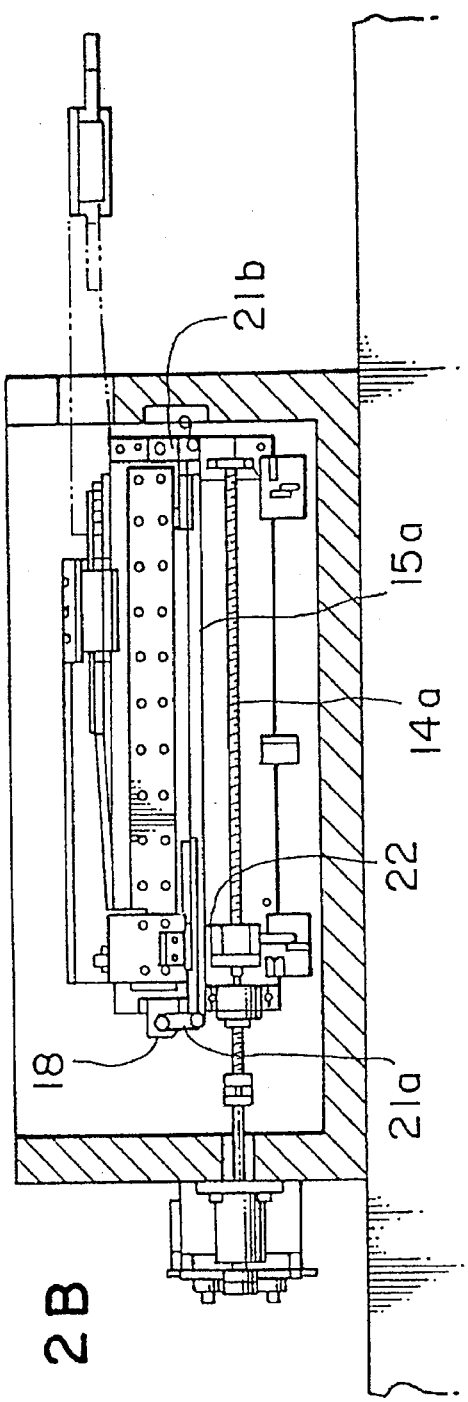
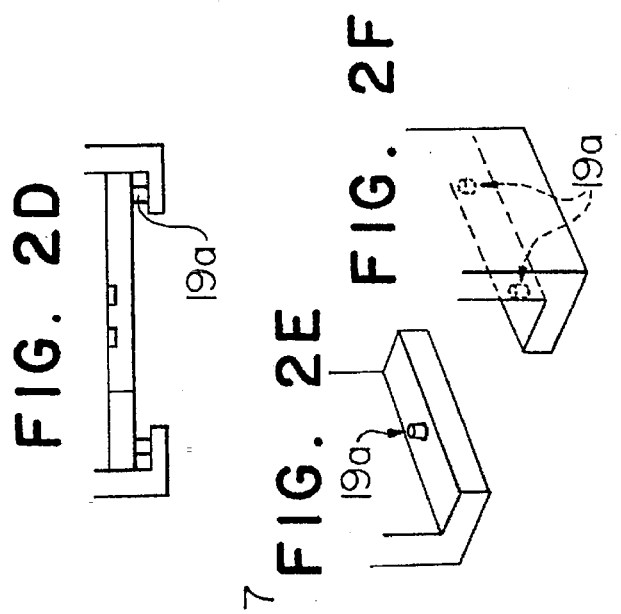
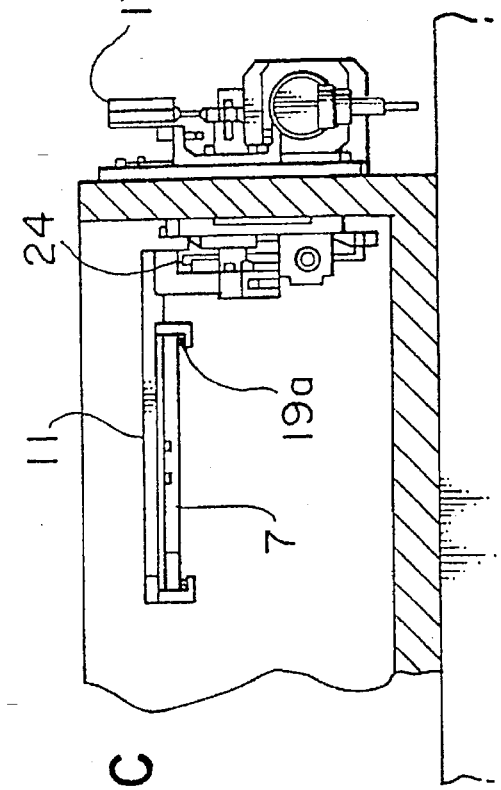
FIG. 2B
FIG. 2C
FIG. 2D
FIG. 2E
FIG. 2F

TRANSFER APPARATUS

This application is a Continuation of application Ser. No. 08/208,902, filed Mar. 11, 1994, now abandoned, which is a Continuation-in-part of Ser. No. 07/941,683, filed Sep. 8, 1992, now abandoned.

BACKGROUND OF THE INVENTION

The present invention relates to a transfer apparatus suitable for transferring a mount on which a wafer is set in a semiconductor manufacturing and inspection system.

In a conventional apparatus, for instance, disclosed in Japanese Patent Unexamined Publication No. 2-163927, pieces of a synthetic resin of low friction coefficient or ball bearings are disposed at fixed intervals at the bottom of and on right and left sides of a transfer line to form guides for the transfer line, so that an object to be transferred or conveyed, which is set on the conveyance line, can be transferred along the guides with the aid of a transfer drive rod for pushing or pulling the object.

Such a conventional apparatus has unavoidably suffered from problems that sliding surfaces of the synthetic resin pieces are worn out or the bearings serving as discontinuous supports are brought into sliding or discontinuous contact with the transferred object, and that the guide surfaces brought into contact with the transferred object generate and disperse foreign matters due to abrasion by the transferred object, which foreign matters will adhere to the transferred object and portions in the vicinity of the transfer line. Further, since increment of the transferring speed makes the above problems more serious, the speed cannot be increased above a fixed speed. In addition, in case that the transferring distance is large, it becomes necessary not only to thicken the transfer drive rod for enhancing its rigidity but also to make the rod as well as a driving unit therefor longer than the transferring distance, with the result that the transfer driver rod portion is made to protrude greatly out of the apparatus, thereby requiring a large installation space.

SUMMARY OF THE INVENTION

In the above-described prior art, no consideration is given to the sliding and discontinuous contact between the transferred object and the transfer guides, resulting in the problems of generation and dispersion of foreign matters as well as of incapability of speeding up the transference. Further, the transfer apparatus is so arranged as to be extended in the direction of the transfer line, resulting in the problem that the apparatus is increased in size.

An object of the present invention is to minimize the holding contact area between an object to be transferred and a transferring arm and provide no guide in the course of transference to thereby prevent generation and dispersion of foreign matters and increase the transferring speed.

Another object of the invention is to prevent a transfer apparatus from protruding out of a main apparatus, in which the transfer apparatus is to be incorporated, in the transferring direction for the dimension corresponding to the transferring distance.

Still another object of the invention is to facilitate positioning of the transferred object on a fixing table and holding of the same on the transferring arm.

A further object of the invention is to enable the transferred object fixing table to move easily without interfering with the transfer apparatus.

A still further object of the invention is to change the transferring direction of the transferred object easily through the fixing table.

To this end, according to the invention, a transfer apparatus is disposed substantially in parallel with a transfer line and has a structure in which a transferring arm serves to lift an object to be transferred so as to transfer the same without assistance of any guide and contact of the object therewith. The transferred object is formed in a lower surface thereof with grooves into which projections formed on the transferring arm and the fixing table are to be fitted so as to set and fix the transferred object in position.

Further, it is preferable that the waiting position of the transfer apparatus is located at the center of the transfer line. In addition, it is preferable that the transferred object has a structure which enables the object to be held by the transferring arm from a direction crossing the transferring path.

The transferring arm has a vertically moving mechanism and another mechanism which serves to selectively hold the vertical position of transferring arm when the arm moves in the transferring direction. A transferring direction moving mechanism can serve as a moving guide and a feeding mechanism which have sufficient holding rigidity when the transferring arm holds the transferred object so that, since nothing newly comes into contact with the transferred object during transference, it is possible to prevent generation and dispersion of foreign matters.

The transfer apparatus is disposed substantially parallel with the transferring line, and therefore, there is no need to provide a mechanism for protruding in the direction of the transfer line for the same space as the transferring stroke. This makes it possible to form the apparatus compactly as a whole.

Fixing and positioning of the transferred object is performed by making use of the grooves formed in the lower surface of the transferred object. Therefore, by arranging selectively the projections to be formed on the transferring arm and the fixing table so that they are prevented from interfering with each other, it becomes possible to simplify the fixing and positioning mechanism.

By locating the waiting position of the transferring arm at the center of the transfer line, it is possible to prevent the fixing table from interfering with the transferring arm when the fixing table is enabled to move.

BRIEF DESCRIPTION OF DRAWINGS

FIGS. 2A, 2B, 2C, 2D, 2E and 2F are detail views of a transferring arm driving unit used in the transfer apparatus of FIG. 1;

DESCRIPTION OF EMBODIMENT

Figure 1:
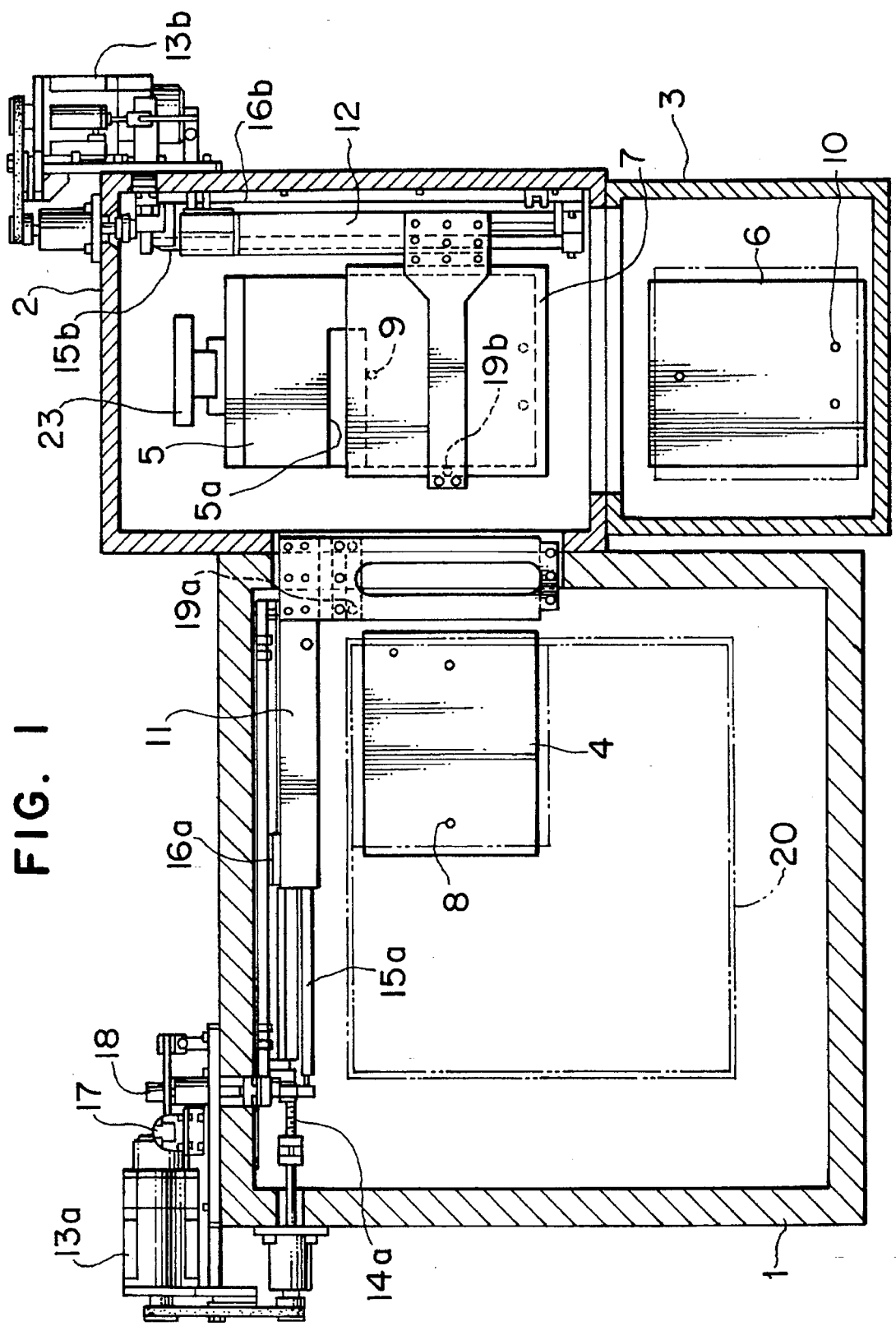
FIG. 1 is a plan view of a transfer apparatus according to an embodiment of the invention.

FIG. 1 illustrates the entire of the apparatus in the case where an object or mount 7 to be transferred is transferred from a container 1 to a container 2 and further to a container 3.

A transferring arm 11 provided in the container 1 is shown as being in its waiting position which is located in the middle of a transferring path between the containers 1 and 2. This waiting position is so set that the transferring arm is prevented from interfering with a movement range 20 of a horizontally movable fixing table 4.

A vertically movable fixing table 5 provided in the container 2 is formed with a slot 5a with the intention of preventing an arm portion of the transferring arm 11 from interfering with the vertically movable fixing table 5 when moved thereabove. Another transferring arm 12 provided in the container 2 is designed to have its waiting position in the middle of another transferring path from the container 2 to the container 3, and in the drawing, it is shown as being in the state of taking the transferred object 7 from the vertically movable fixing table 5.

Figure 3:
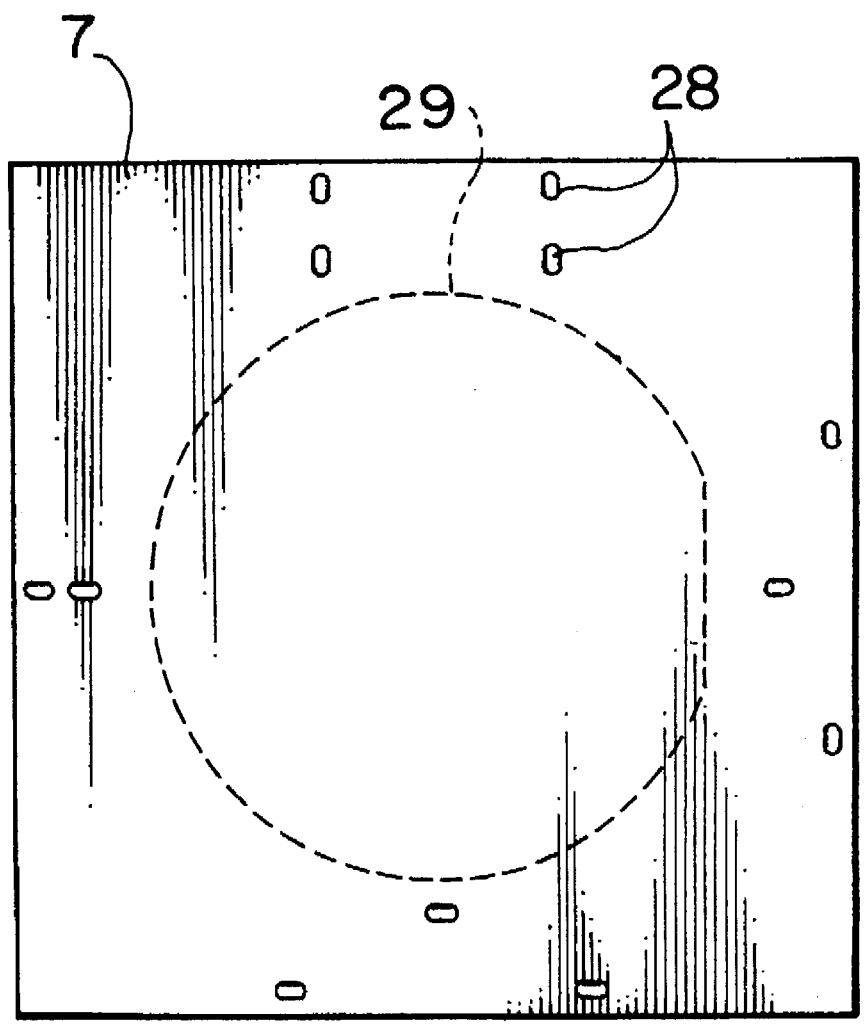
FIG. 3 is an illustration showing an example of the arrangement of grooves formed in the lower surface of an object to be transferred.

The transferring arm 11 has projections 19a (FIGS. 2A, 2B, 2C) formed on the arm portion thereof, and these projections are to be fitted in groove portions 28 which are formed in the transferred object with guide grooves thereof arranged at right angles with each other as shown in FIG. 3, so as to generate a holding force by which the transferred object 7 can be prevented from being moved due to a horizontal force generated with acceleration and deceleration during the transference. The transferring arm 12 has on the arm portion thereof projections 19b of the same function as well.

The horizontally movable fixing table 4, the vertically movable fixing table 5 and a fixing table 6 provided in the container 3 are formed with positioning projections 8, 9 and 10, respectively, which projections serve to fix the transferred object 7 in position.

FIGS. 2A, 2B and 2C are a plan view, a front view and a right side view of the transferring arm 11 including a driving unit thereof, respectively.

The transferring arm 11 has a function of moving up and down by means of a vertical linear guide 24. The vertical movement of the transferring arm 11 is performed by the operation of the following mechanism. First, the rectilinear motion of an air cylinder 17 is transmitted through a lever mechanism to a rotary shaft 18 as rotational motion to cause a vertical guide arm 21a to rotate. By the rotation of this vertical guide arm 21a, a vertical guide 15a is caused to move together with a vertical guide arm 21b so that the vertical guide 15a is moved up and down. The vertical guide 15a and the vertical linear guide 24 are connected with each other through a linear bush 22, so that the vertical position of the transferring arm 11 can be selected and maintained by the vertical guide 15a even when the transferring arm 11 is being moved. The vertical linear guide 24 is formed on a linear guide 16a in such a manner that the directions of movement thereof are made to meet at right angles with each other, so that the vertical linear guide 24 can be moved in the transferring direction together with the transferring arm 11. In case of driving the transferring arm 11 formed on the linear guide 16a in the horizontal direction, rotation of a motor 13a is transmitted to a ball screw 14a through a belt 25, a bearing 26 and a coupling 27 so as to drive the linear guide 16a.

The transferring arm 11 in its waiting position is moved horizontally toward the fixing table, on which the transferred object 7 is put, at such low height that the projections 19a formed on the arm portion do not interfere with the transferred object 7. The transferred object 7 is taken from below by the projections 19a on the arm portion of the transferring arm 11 and lifted up to a level where it can be kept away from the interference of the positioning projections on the fixing table in the horizontal direction. The transferred object is transferred horizontally as being kept in this condition and set down on the positioning projections on the objective fixing table. Then, the projections 19a on the arm portion are released from the groove portions of the transferred object 7 and moved down to a level where the projections 19a and the transferred object 7 are prevented from interfering with each other. After that, the transferring arm is moved horizontally back to the waiting position, thus completing the transferring operation.

FIG. 3 illustrates an example of the arrangement of the positioning groove portions formed in the lower surface of the transferred object or mount 7. FIG. 3 shows an embodiment wherein the object or mount 7 has a portion 29 on which a wafer is set, e.g., when the apparatus is used in a semiconductor manufacturing and inspection system.

Further, in case that the containers 1, 2 and 3 are each made to have a function of serving as a vacuum container, it becomes possible to transfer the object under vacuum as well by providing magnetic fluid seals in the rotary shaft 18 and the bearing portion 26.

Figure 4:
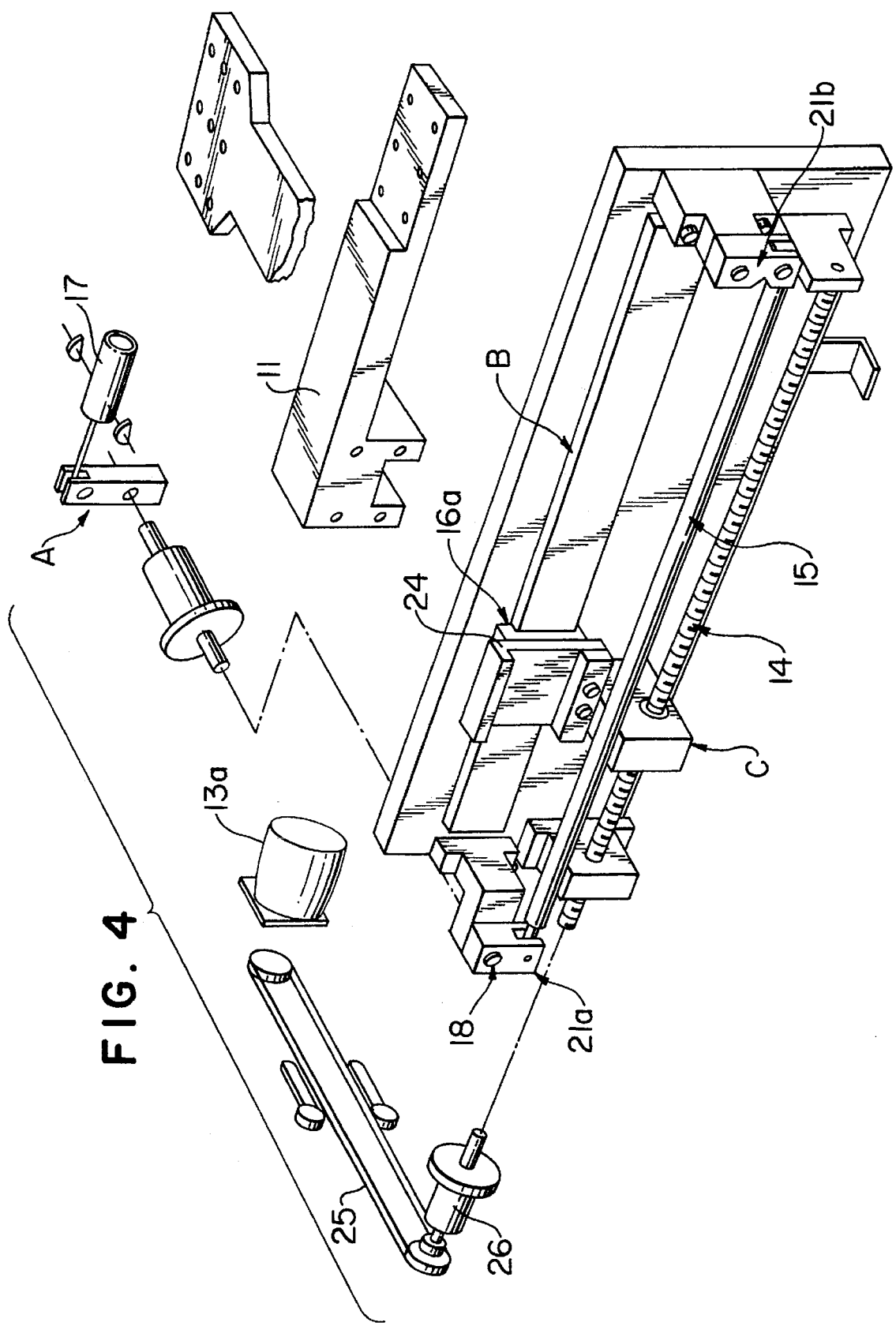
FIG. 4 is an exploded view of a vertical transfer structure for the arm of the transfer apparatus of the present invention.

As shown in FIG. 4, the transfer arm 11 is mounted on the vertical linear guide 24. The guide 24 is connected to the vertical guide 15a through the linear bush 22 (FIG. 2B) so as to be slidable along the guide 15a. The guide 15a is swingably supported at opposite ends by the vertical guide arms 21a, 21b. The guide arm 21b is rotatably supported, while the guide arm 21a is fixed at the end of the rotary shaft 18. The other end of the shaft 18 is connected to the air cylinder 17 through a lever mechanism A. The air cylinder 17 is pivotally mounted.

The mechanism A comprises a lever which is fixed at one end thereof to the shaft 18 through a bearing and is rotably connected at the other end to the cylinder 17 to convert a reciprocating motion of the cylinder 17 into an arcuate rotation of the shaft 18. Upon arcuate rotation of the shaft 18, the guide arm 21a, makes an arcuate motion to swing the guide 15a either in an upward or downward direction, so that the transfer arm 11 is moved vertically through the guide 24.

The linear guide 16a slidably engages with a horizontal guide bar B which is stationary. The guide 16a is connected to a ball-screw nut C for movement therewith, and the ball-screw nut C engages with the ball screw or worm 14a.

Moreover, the guide 16a is connected to the vertical linear guide 24 so as to allow vertical movement of the guide 24. Upon rotation of the ball screw or worm 14a, the ball-screw nut C is driven to move the guides 16a and 24 along the horizontal guide bar, so that the transfer arm 11, mounted on the guide 24 is horizontally movable.

With the construction described above, the invention can achieve the following meritorious results.

Since there needs no member for guiding the transferred object, nothing comes into contact with the transferred object during the transference, thereby making it possible to prevent generation, dispersion and adhesion of foreign matters. Further, the transferring arm is guided by the continuous guide mechanism such as the linear guide, and therefore, it becomes possible to increase the transferring speed. Also, since the transferring mechanism is disposed in parallel with the transferring path, there is no need to make the transferring mechanism protrude out of the main apparatus by an amount corresponding to the transferring distance, thereby making it possible to reduce the size of the apparatus as a whole. Moreover, since positioning and fixing can be performed by means of the groove portions of the transferred object and the projections of the fixing table and the transferring arm, it is possible to simplify the positioning and fixing mechanism. In addition, by setting the waiting position of the transferring arm in the middle of the transferring path, it is possible to prevent interference even when the fixing table is enabled to move.

What is claimed is:

1. A transferring apparatus for transferring generally planar articles comprising:

at least one mount for placement of an article thereon, the mount having spaced apart groove portions in a lower side of said mount, the groove portions being formed on at least two opposite sides of the mount with at least one groove portion on one side of the mount arranged at a right angle with the groove portions on an opposite side of the mount;

at least two fixing tables spaced apart from each other in a transfer direction along which the mount is transferred for placement of the mount on the at least two fixing tables;

a movable transferring arm disposed substantially in parallel with the transfer direction, the transferring arm having arm portions having upward projections for fitting in the groove portions of the mount to support the mount at the groove portions in a substantially horizontal position; and a drive mechanism connected to the transferring arm for moving the transferring arm vertically and horizontally to cause the transferring arm to lift up the mount from one of the at least two fixing tables while holding the mount in the substantially horizontal position and preventing horizontal movement of the mount relative to the arm by engagement of the projections with the groove portions and transferring the mount horizontally and thereafter placing the mount onto another of the at least two fixing tables.

2. A transfer apparatus according to claim 1 wherein:

each of the at least two fixing tables has projections for fitting into additional groove portions of the mount to position the mount, the additional groove portions being formed at right angles with one another in the lower side of the mount.

3. A transfer apparatus according to claim 1 wherein:

at least one of the at least two fixing tables is movable, the transferring arm has a waiting position where the transferring arm is stopped when not being operated, and the waiting position is located midway in a range of horizontal movement of the transferring arm and out of a range of movement of the movable fixing table so that the transferring arm, when not being operated, does not interfere with movement of the movable fixing table.

4. A transfer apparatus according to claim 1 wherein:

the drive mechanism moves the transferring arm horizontally while raising the transferring arm when the transferring arm carries the mount so that the mount does not interfere with the at least two fixing tables, and the drive mechanism moves the transferring arm horizontally while lowering the transferring arm when the transferring arm does not carry a mount so that the transferring arm does not interfere with the mount on one of the at least two fixing tables.

5. A transfer apparatus according to claim 1 further comprising:

two transferring systems, each transferring system comprising at least two fixing tables, the transferring arm and the drive mechanism and one of the fixing tables in the transferring systems is common to the two transferring systems so that the transferring systems cross each other at the common fixing table and the mount is transferred between the two transferring systems via the common fixing table.

6. A transfer apparatus according to claim 5, wherein:

the common fixing table is movable vertically and is formed with a slot for receiving an arm portion of the transferring arm of one of the transferring systems to prevent interference therewith.

* * * * *